United States Patent
Park

(10) Patent No.: US 7,923,327 B2
(45) Date of Patent: Apr. 12, 2011

(54) METHOD OF FABRICATING NON-VOLATILE MEMORY DEVICE WITH CONCAVELY DEPRESSED ELECTRON INJECTION REGION

(75) Inventor: Sung Kun Park, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 220 days.

(21) Appl. No.: 12/144,755

(22) Filed: Jun. 24, 2008

(65) Prior Publication Data
US 2009/0001445 A1  Jan. 1, 2009

(30) Foreign Application Priority Data

Jun. 26, 2007 (KR) .................. 10-2007-0062643

(51) Int. Cl.
*H01L 21/336* (2006.01)
(52) U.S. Cl. ........ 438/260; 257/315; 257/317; 257/318; 257/322; 365/185.01; 365/185.05; 365/185.08; 365/185.09; 365/185.14; 365/185.17; 365/185.26; 365/185.28; 365/185.29; 365/185.33; 438/201; 438/202; 438/257; 438/258; 438/259; 438/261; 438/262; 438/263; 438/264; 438/265; 438/266; 438/267; 438/271; 438/290; 438/291; 438/292; 711/103
(58) Field of Classification Search ............... 257/315, 257/322, 318; 365/185.01, 185.29, 185.33, 365/189.05, 185.08, 185.09, 185.05, 185.14, 365/185.17, 185.26, 185.28; 711/103; 438/201, 438/202, 257–267, 271, 289, 290, 291, 292
See application file for complete search history.

(56) References Cited

U.S. PATENT DOCUMENTS

| | | | | |
|---|---|---|---|---|
| 5,272,368 A | * | 12/1993 | Turner et al. | 365/185.1 |
| 5,376,572 A | * | 12/1994 | Yang et al. | 438/264 |
| 5,424,233 A | * | 6/1995 | Yang et al. | 438/264 |
| 5,429,965 A | * | 7/1995 | Shimoji | 438/287 |
| 5,761,126 A | * | 6/1998 | Chi et al. | 365/185.27 |
| 6,172,392 B1 | * | 1/2001 | Schmidt et al. | 257/315 |
| 6,184,086 B1 | * | 2/2001 | Kao | 438/259 |
| 6,930,002 B1 | * | 8/2005 | Chen et al. | 438/266 |
| 2005/0030827 A1 | * | 2/2005 | Gilliland et al. | 365/232 |
| 2007/0228467 A1 | * | 10/2007 | Kurachi | 257/347 |

FOREIGN PATENT DOCUMENTS

| | | | | |
|---|---|---|---|---|
| JP | 05075135 A | * | 3/1993 | |
| KR | 2007065000 A | * | 6/2007 | |

* cited by examiner

*Primary Examiner* — N Drew Richards
*Assistant Examiner* — John P Dulka
(74) *Attorney, Agent, or Firm* — Saliwanchik, Lloyd & Eisenschenk

(57) ABSTRACT

Provided are a non-volatile memory device and a method of fabricating the same. The non-volatile memory device comprises: a control gate region formed by doping a semiconductor substrate with second impurities; an electron injection region formed by doping the semiconductor substrate with first impurities, where a top surface of the electron injection region includes a tip portion at an edge; a floating gate electrode covering at least a portion of the control gate region and the tip portion of the electron injection region; a first tunnel oxide layer interposed between the floating gate electrode and the control gate region; a second tunnel oxide layer interposed between the floating gate electrode and the electron injection region; a trench surrounding the electron injection region in the semiconductor substrate; and a device isolation layer pattern filled in the trench.

6 Claims, 6 Drawing Sheets

METHOD OF FABRICATING NON-VOLATILE MEMORY DEVICE WITH CONCAVELY DEPRESSED ELECTRON INJECTION REGION

RELATED APPLICATION

The application claims priority under 35 U.S.C. §119(e) of Korean Patent Application No. 10-2007-0062643 filed on Jun. 26, 2007, which is hereby incorporated by reference in its entirety.

BACKGROUND

Because a non-volatile memory retains stored data even when there is no power supply, it is often used for data storage in systems such as a personal computer (PC) basic input/output system (BIOS), a set-top box, a printer, and a network server. Recently, non-volatile memory is being used in digital cameras and mobile phones.

One common non-volatile memory is an electrically erasable programmable read-only memory (EEPROM) flash memory device. In the EEPROM flash memory device, during a programming operation, channel hot electrons form in a drain region to accumulate electrons in a floating gate, such that a threshold voltage of a cell transistor is increased.

Then, during an erasing operation, the EEPROM flash memory device generates a high voltage to discharge the electrons accumulated in the floating gate, such that a threshold voltage of a cell transistor is decreased. An EEPROM flash memory device can electrically erase data of a memory cell simultaneously or according to sector unit.

As the degree of integration continues to increase, the miniaturization of a cell size becomes extremely important. However, because the floating gate cell requires a high voltage during programming or erasing operations, and because it is difficult to obtain a process margin for tunnel definition, further miniaturization is becoming extremely difficult and may be almost impossible.

Due to the above limitations, research for non-volatile memory devices substituting a floating gate cell is under active development.

BRIEF SUMMARY

Embodiments of the present invention provide a non-volatile memory device and a method of fabricating the same.

An embodiment of the present invention also provides a non-volatile memory device capable of lowering a program voltage.

In one embodiment, a non-volatile memory device comprises: a control gate region formed by doping a semiconductor substrate with second impurities; an electron injection region formed by doping the semiconductor substrate with first impurities, where the electron injection region can have a tip portion at an edge and a concave top surface; a floating gate electrode covering at least a portion of the control gate region and the tip portion of the electron injection region; a first tunnel oxide layer between the floating gate electrode and the control gate region; a second tunnel oxide layer between the floating gate electrode and the electron injection region; a trench surrounding the electron injection region in the semiconductor substrate; and a device isolation layer pattern filled in the trench.

A method of fabricating a non-volatile memory device according to an embodiment comprises: forming an oxide layer and a nitride layer on a semiconductor substrate; forming a first nitride layer pattern by selectively etching the nitride layer; doping the semiconductor substrate with first impurities using the first nitride layer pattern as a mask to form an electron injection region; forming a partial oxide layer pattern thicker than the oxide layer by oxidizing the electron injection region exposed by the first nitride layer pattern; forming a second nitride layer pattern by selectively etching the first nitride layer pattern; etching the semiconductor substrate by using the second nitride layer pattern and the partial oxide layer pattern as a mask to form a trench around the electron injection region; forming a device isolation layer pattern by gap-filling the trench with a dielectric and then removing the second nitride layer pattern; forming a control gate region by selectively implanting the semiconductor substrate with second impurities; selectively etching the partial oxide layer pattern and a portion of the device isolation layer pattern to expose a top surface and a side surface of the electron injection region; forming a first tunnel oxide layer and a second tunnel oxide layer by re-oxidizing an entire surface of the semiconductor substrate, the first tunnel oxide layer being on the control gate region, the second tunnel oxide layer being on the top surface and the side surface of the electron injection region; and forming a floating gate electrode covering at least a portion of the control gate region and an edge of the electron injection region.

According to an embodiment, provided is a non-volatile memory device capable of lowering a program voltage by using a tunneling tip. Because the program voltage is lowered, the size of a memory cell can be reduced and its structure becomes simpler. Therefore, its manufacturing costs can be reduced.

In addition, because a non-volatile memory device according to an embodiment of the present invention lowers a program voltage, an additional circuit is unnecessary and also less power consumption is required.

The details of one or more embodiments are set forth in the accompanying drawings and the description below. Other features will be apparent from the description and drawings, and from the claims.

DETAILED DESCRIPTION

Figure 1:
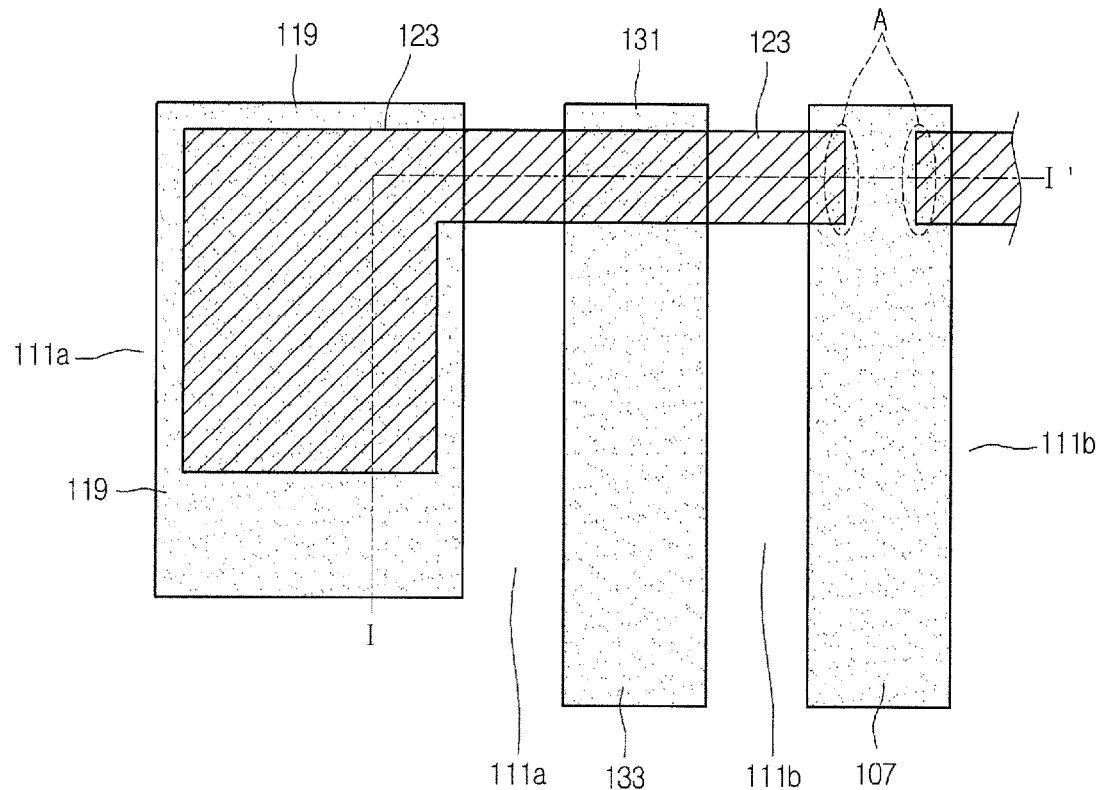
FIG. 1 is a plan view illustrating a unit cell of a non-volatile memory device according to an embodiment of the present invention.

Hereinafter, a method of fabricating a semiconductor device according to embodiments will now be described in detail with reference to the accompanying drawing. It should be understood that numerous other additions, deletions, modifications, and embodiments can be suggested by those skilled in the art upon review of the subject disclosure that will fall within the spirit and scope of the principles of this disclosure.

In addition, it will also be understood that when terms such as "first" and "second" are used to describe members, the members are not limited by these terms. For example, a plurality of members may be provided. Therefore, when the terms "first" and "second" are used, it will be apparent that the plurality of members may be provided. In addition, the terms "first" and "second" can be selectively or interchangeably used for the members. In the figures, a dimension of each of elements is exaggerated for clarity of illustration, and the dimension of each of the elements may be different from an actual dimension of each of the elements. Not all elements illustrated in the drawings must be included or are limited to the present disclosure.

In the description of embodiments, it will be understood that when a layer (or film), region, pattern, or structure is referred to as being 'on/above/over' another substrate, layer (or film), region, pad, or pattern, it can be directly on the another substrate, layer (or film), region, pad, or pattern, or an intervening layer (or film), region, pad, pattern, or structure may also be present. Further, it will be understood that when a layer (or film), region, pattern, or structure is referred to as being 'down/below/under' another substrate, layer (or film), region, pad, or pattern, it can be directly under the another substrate, layer (or film), region, pad, or pattern, or an intervening layer (or film), region, pad, pattern, or structure may also be present. Therefore, the meanings of the terms are determined according to the spirit and scope of embodiments.

Figure 2:
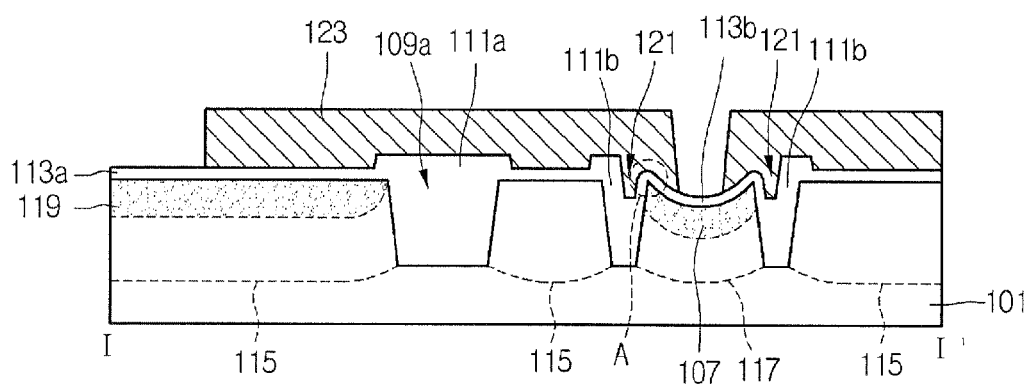
FIG. 2 is a cross-sectional view of a non-volatile memory device according to an embodiment of the present invention, taken along a line I-I' of FIG. 1.

Referring to FIGS. 1 and 2, a unit cell of a non-volatile memory device can include a floating gate electrode formed on a semiconductor substrate 101.

The semiconductor substrate 101 can be formed of any suitable substrate for the memory device. For example, the semiconductor substrate 101 can be a silicon substrate, a silicon on insulator (SOI) substrate, a gallium arsenic (GaAs) substrate, a silicon germanium (SiGe) substrate, a ceramic substrate, a quartz substrate, or a glass substrate for display.

Device isolation layer patterns can be formed in the substrate 101 to define active regions (see shaded regions of FIG. 1). The device isolation layer patterns can include a first device isolation layer pattern 111a for separating a control gate region 119 from source/drain regions 131 and 133 and a second device isolation layer pattern 111b for separating the source/drain regions 131 and 133 from an electron injection region 107.

The control gate region 119 can be formed by doping an active region defined by the first device isolation layer pattern 111a with impurities. The impurities can be second conductive type impurities.

The electron injection region 107 can be formed by doping an active region defined by the second device isolation layer pattern 111b with impurities. The impurities used to dope the electron injection region 107 can be first conductive type impurities.

The top surface of the electron injection region 107 can have a depressed shape along a length direction.

The floating gate electrode 123 can be formed on the semiconductor substrate 101, overlapping at least a portion of the control gate region 119 and at least a portion of the electron injection region 107.

The floating gate electrode 123 crosses over the first device isolation layer pattern 111a and the second device isolation layer pattern 111b to reach the electron injection region 107. The source region 131 and the drain region 133 can be formed on the active region defined by the first device isolation layer pattern 111a and the second device isolation layer pattern 111b at both sides of the floating gate electrodes 123. The portion of the active region below the floating gate electrode 123 and between the source region 131 and the drain region 133 is a channel region.

A first tunneling oxide layer 113a can be interposed between the control gate region 119 and the floating gate electrode 123, and a second tunneling oxide layer 113b can be interposed between the electron injection region 107 and the floating gate electrode 123.

A gate dielectric can also be provided between the channel region of the semiconductor substrate 101 and the floating gate electrode 123.

A first impurity well region 115 can be formed below the control gate region 119 by doping the semiconductor substrate 101 with first conductive type impurities.

The first impurity well region 115 can also be formed below the source/drain regions 131 and 133 by implanting the first conductive type impurities into the semiconductor substrate 101.

A second impurity well region 117 can be formed below the electron injection region 107 by doping the semiconductor substrate 101 with second conductive type impurities.

The electron injection region 107 can include a tip portion A along its edge. The floating gate electrode 123 can overlap the electron injection region 107 such that the tip portion A is covered by the floating gate electrode 123.

During a programming operation of the non-volatile memory device, the tip portion A supplies electrons from the electron injection region 107 to the floating gate electrode 123.

The electron injection region 107 is isolated by the second device isolation layer pattern 111b, and the electron injection region 107 is isolated by the second impurity well region 117.

To program the non-volatile memory device, a negative bias voltage is applied to the electron injection region 107, and a positive bias voltage is applied to the control gate region 119.

According to embodiments of the present invention, the positive bias voltage can be 3 V to 5 V.

FIGS. 3 to 17 are cross-sectional views illustrating a method of fabricating a non-volatile memory device according to an embodiment.

Figure 3:
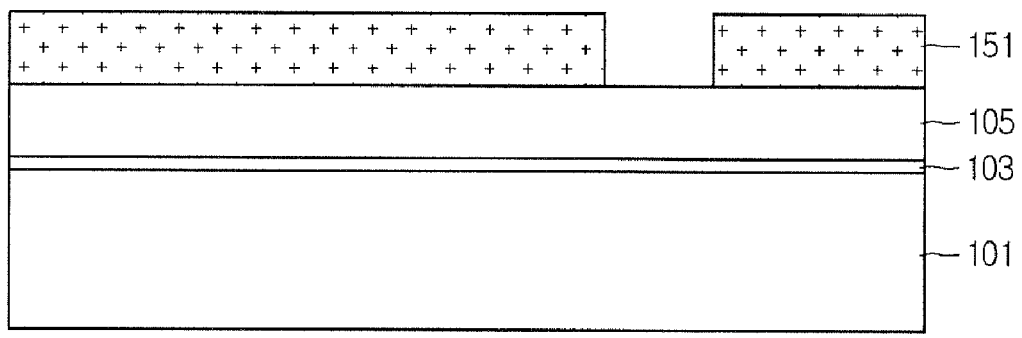
FIGS. 3 to 17 are cross-sectional views illustrating a method of fabricating a non-volatile memory device according to an embodiment of the present invention.

Referring to FIG. 3, an oxide layer 103 can be formed on a semiconductor substrate 101. The oxide layer 103 can be a silicon oxide layer formed through a thermal oxidation process.

Then, a nitride layer 105 can be formed on the oxide layer 103.

In one embodiment, a first photoresist pattern 151 can be formed on the nitride layer 105 by coating the substrate 101 with photoresist and performing a photolithography process.

Figure 4:
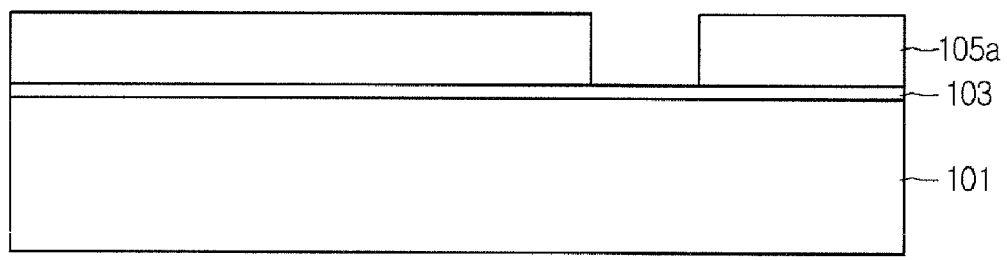

Referring to FIG. 4, the nitride layer 105 can be etched by using the first photoresist pattern 151 as an etching mask in order to form a first nitride layer pattern 105a.

Then, the first photoresist pattern 151 can be removed.

Figure 5:
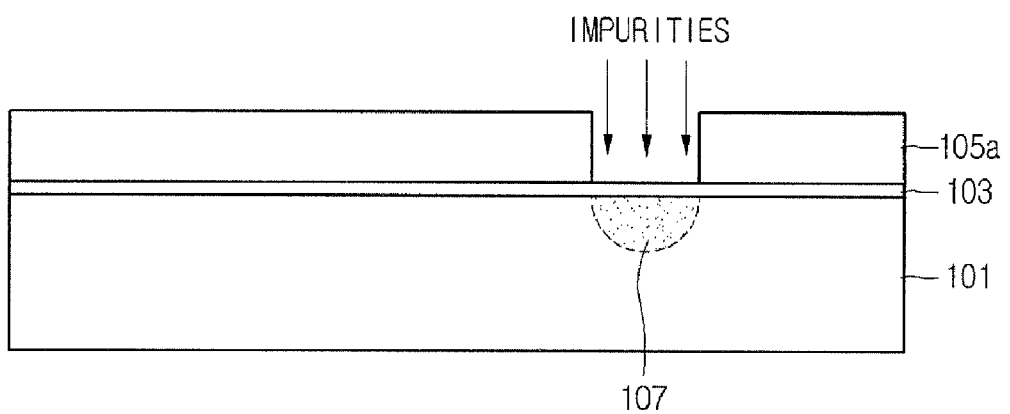

As illustrated in FIG. 5, first impurities can be implanted into the semiconductor substrate 101 by using the first nitride layer pattern 105a as a mask in order to form an electron injection region 107. The first impurities can be implanted at high concentration.

The first impurities can be p-type impurities. The p-type impurities include boron (B), for example.

According to an embodiment, because the electron injection region 107 is formed before forming a device isolation layer pattern, adverse effects to the logic performance of a device can be minimized.

Figure 6:
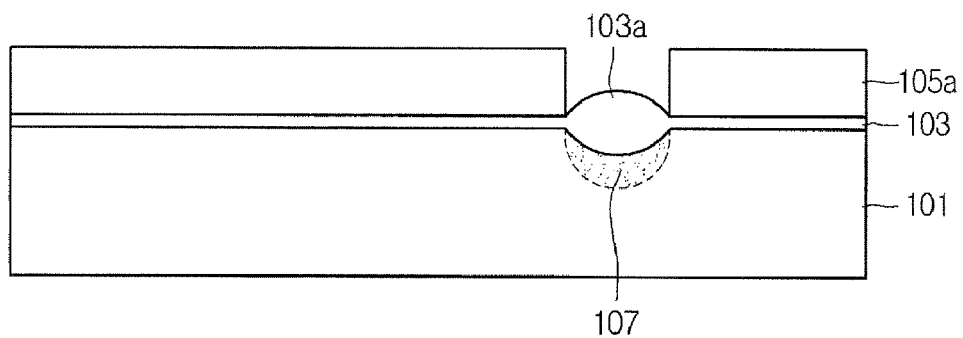

Referring to FIG. 6, a partial oxide layer 103a can be formed on the electron injection region 107 of the semiconductor substrate 101 using the first nitride layer pattern 105a as a hard mask to grow the oxide layer 103.

Since the first nitride layer pattern 105a suppresses the formation of the oxide layer 103a on the semiconductor substrate 101, the cross-section of the partial oxide layer 103a has a convex lens shape where the central part has a thicker thickness than the edge.

Figure 7:
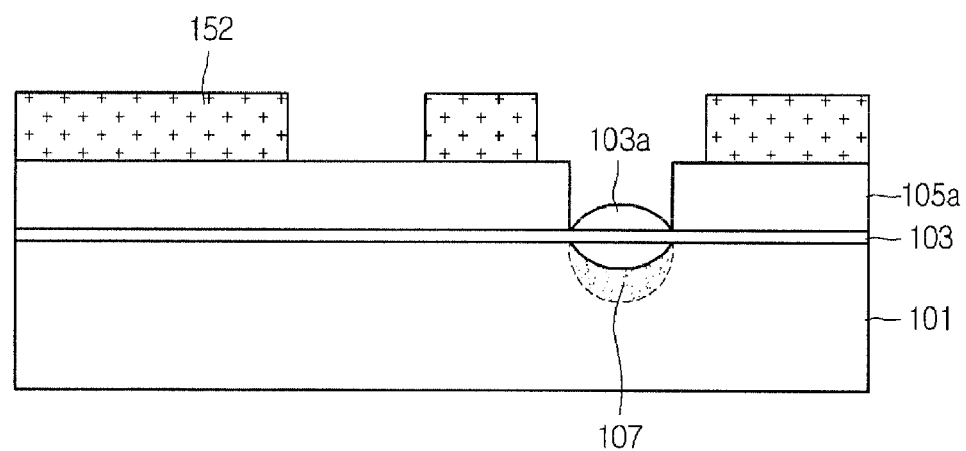

Referring to FIG. 7, a second photoresist pattern 152 can be formed on the first nitride layer pattern 105a.

The second photoresist pattern 152 can be used for forming the device isolation layer patterns 111a and 111b.

The second photoresist pattern 152 also exposes the partial oxide layer 103a.

Figure 8:
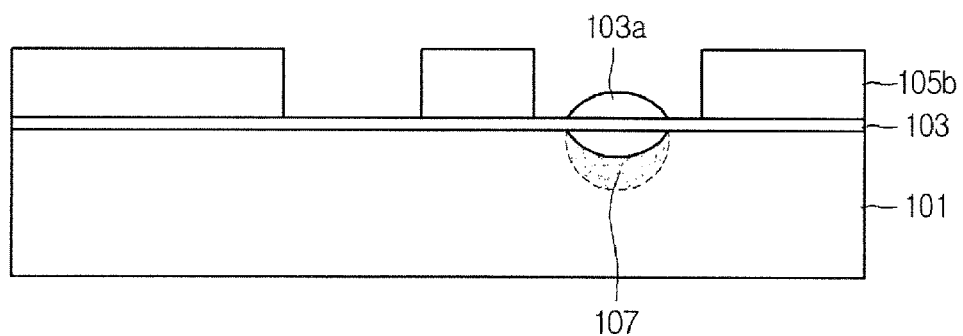

Referring to FIG. 8, the first nitride layer pattern 105a can be etched by using the second photoresist pattern 152 as a mask in order to form a second nitride layer pattern 105b.

Figure 9:
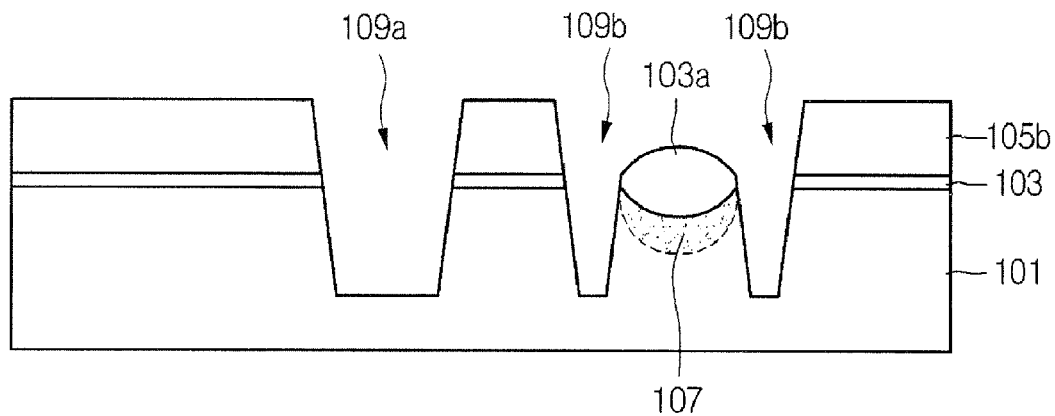

Then, referring to FIG. 9, a first trench 109a and a second trench 109b can be formed. The oxide layer 103 and the semiconductor substrate 101 can be etched to a predetermined depth by using the second nitride layer pattern 105b as a mask in order to form the first trench 109a. The second trench 109b can be formed using the second nitride layer pattern 105b and the partial oxide layer 103a as a mask.

Because the partial oxide layer 103a has the thicker thickness than the oxide layer 103, the partial oxide layer 103a can serve as a self etching mask.

By using the self etching mask, misalignment and pattern defects that occur when using a photomask can be avoided and additional mask costs can be reduced.

The second trench 109b is formed at the sides of the partial oxide layer 103a to surround the electron injection region 107.

Figure 10:
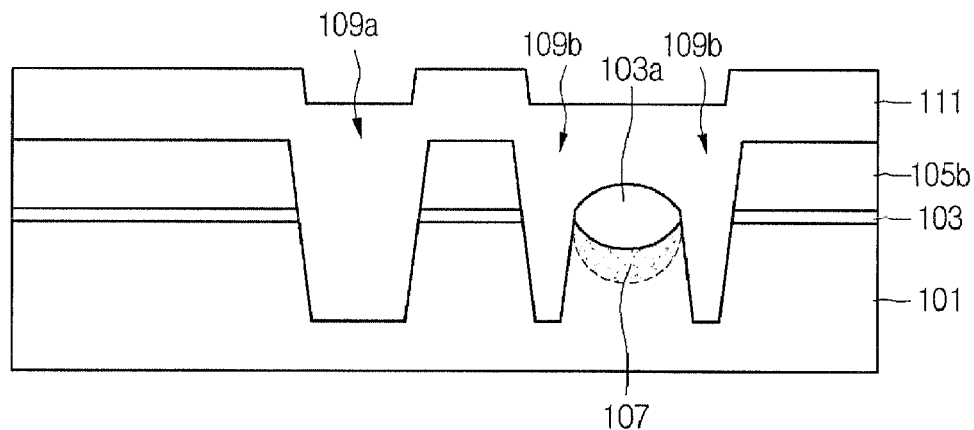

Referring to FIG. 10, a dielectric 111 can be formed with a sufficient thickness on the semiconductor substrate 101 to gap-fill the first trench 109a and the second trench 109b.

In many embodiments, the dielectric 111 can be an oxide insulation layer.

For example, the oxide insulation layer can include, but is not limited to, Plasma Enhanced TetraEthylOrthoSilicate (P-TEOS), Undoped Silica Glass (USG), BoroPhosphoSilica Glass (BPSG), and Spin On Glass (SOG).

Figure 11:
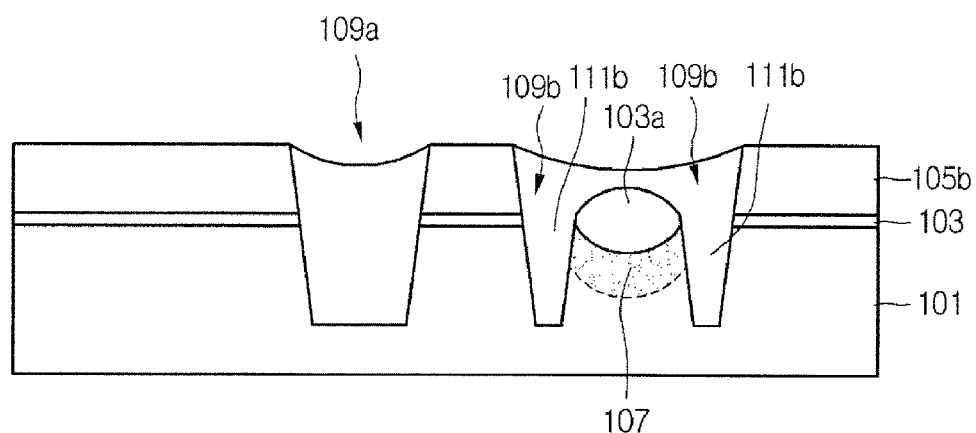

Referring to FIG. 11, the dielectric 111 can be polished for planarization through a chemical mechanical polishing (CMP) process. In one embodiment, the dielectric 11 can be over polished.

Figure 12:
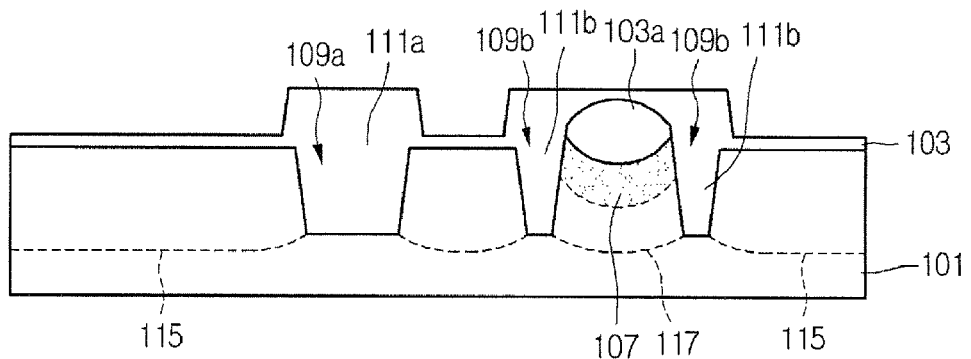

Referring to FIG. 12, the second nitride layer pattern 105b can be removed. The nitride layer 105 can be removed through a wet etching process using, for example, $H_2PO_4$ solution.

Thus, a first device isolation layer pattern 111a is provided in the first trench 109a and a second device isolation layer pattern 111b is provided in the second trench 109b.

Then, a well region can be formed on the semiconductor substrate 101 through a mask process for a well formation.

First impurities can be implanted into the substrate 101 to form a first impurity well region 115. For regions such as the electron injection region 107, a mask can be used to cover the substrate from the implanting of first impurity dopants.

Second impurities can be implanted below the electron injection region 107 to form a second impurity well region 117. A mask can be used to expose only the regions where the second impurities are to be implanted.

Figure 13:
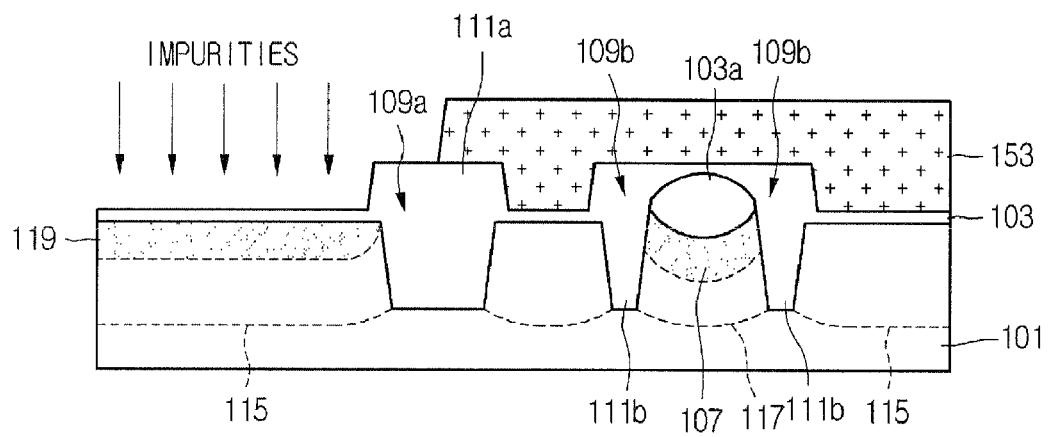

Referring to FIG. 13, a third photoresist pattern 153 can be formed on the semiconductor substrate 101.

Second impurities can be implanted into an active region of the semiconductor substrate 101 using the third photoresist pattern 153 in order to form a control gate region 119. The second impurities can be implanted at a high concentration. The second impurities can be n-type impurities.

At this point, the oxide layer 103 of the control gate region 119 may be oxidized during the impurity doping such that its thickness becomes thicker.

Then, the third photoresist pattern 153 can be removed.

Figure 14:
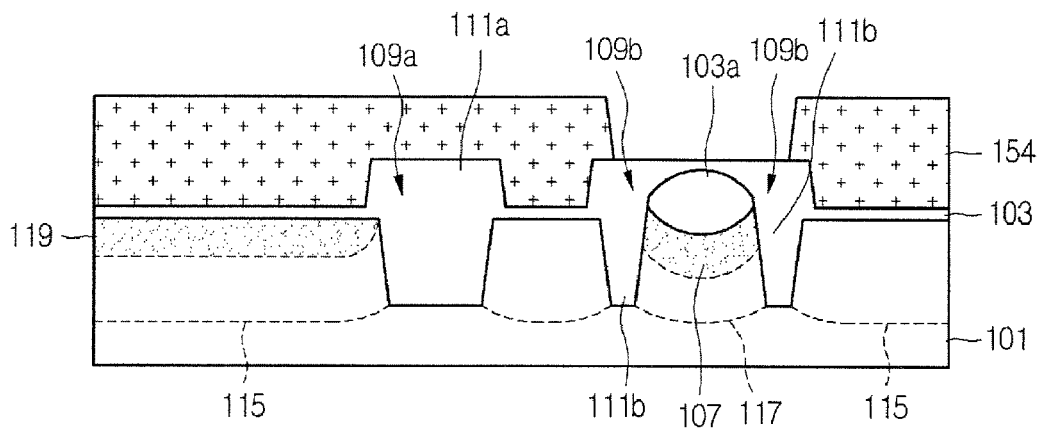

Referring to FIG. 14, a fourth photoresist pattern 154 can be formed on the semiconductor substrate 101.

The fourth photoresist pattern 154 exposes the electron injection region 107. At this point, the fourth photoresist pattern 154 can also expose a portion of the second device isolation layer pattern 111b formed at the both sides of the electron injection region 107.

Figure 15:
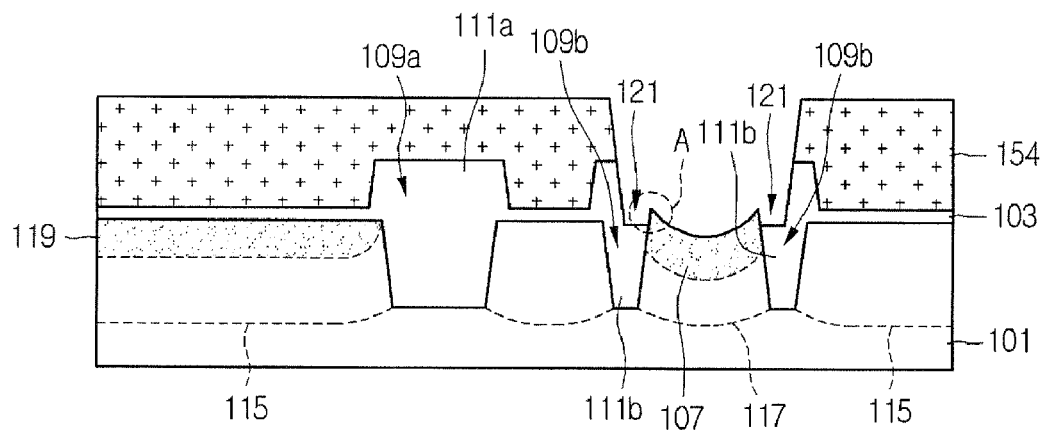

Referring to FIG. 15, the second device isolation layer pattern 111b and the partial oxide layer 103a can be etched by using the fourth photoresist pattern 154 as a mask in order to expose the tip portion A formed at the edge portion of the electron injection region 107.

The second device isolation layer pattern 111b can be etched lower than the tip portion A to provide grooves 121 at sides of the electron injection region 107.

Because the partial oxide layer 103a of the convex lens shape is removed, the top surface of the electron injection region 107 is depressed and the tip portion A protrudes at the side edges.

According to an embodiment, the second device isolation layer pattern 111b and the partial oxide layer 103a can be removed through a wet etching process in order to inhibit damage to the tip portion A.

For example, if a hydrogen fluoride (HF) series is used as a wet etching solution, the tip portion A needs to be protected by increasing the etch selectivity of the oxide layer 103 to the semiconductor substrate 101.

After performing the etching process, the fourth photoresist pattern 154 can be removed.

Figure 16:
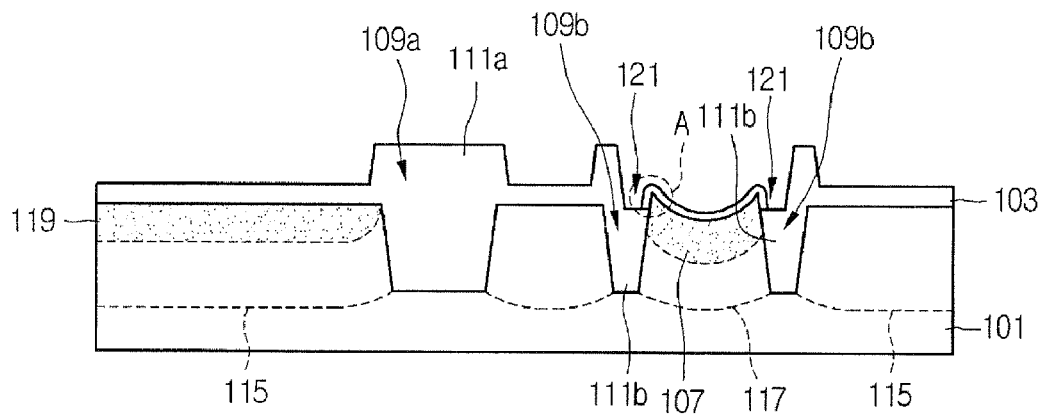

Referring to FIG. 16, the top surface of the semiconductor substrate 101 of the electron injection region 107 can be oxidized by oxidizing the entire surface of the semiconductor substrate 101, and the oxide layer 103 of the control gate region 119 can be re-oxidized to increase its thickness.

The oxidation method can include a thermal oxidation method or a chemical vapor deposition (CVD) method. In one embodiment, the oxidation method can be a high temperature oxide (HTO) deposition method using a $SiH_4$ at a temperature ranging from about 800° C. to about 900° C.

Therefore, a first tunneling oxide layer 113a (see FIG. 2) can be formed on the control gate region 119, and a second tunneling oxide layer 113b (see FIG. 2) can be formed on the electron injection region 107.

The second tunneling oxide layer 113b surrounds the tip portion A and can have a uniform thickness.

In an embodiment, the second tunneling oxide layer 113b can have a thickness of about 100 Å to about 200 Å.

The thickness of the first tunneling oxide layer 113a can be thicker than that of the second tunneling oxide layer 113b.

As such, the thickness of the second tunneling oxide layer 113b can be thinner than that of the first tunneling oxide layer 113a.

Figure 17:
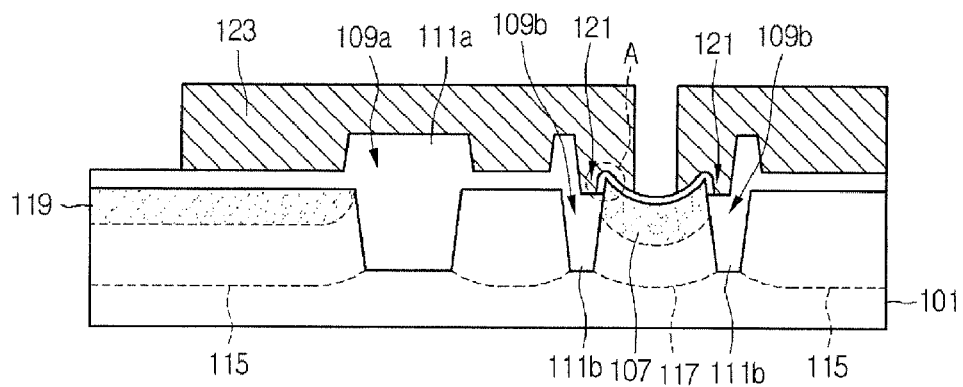

Referring to FIG. 17, a polysilicon layer can be formed on the entire surface of the semiconductor substrate 101. Then, a floating gate electrode 123 can be formed using the polysilicon layer through photolithography and etching processes.

In one embodiment, polysilicon layer for forming the floating gate electrode 123 can be formed by depositing doped polysilicon. To deposit doped polysilicon, the polysilicon can be simultaneously deposited and doped in-situ. In another method, undoped polysilicon is formed first, and then impurities are implanted on the undoped polysilicon to form the doped polysilicon.

The floating gate electrode 123 covers at least a portion of the control gate region 119. In addition, the floating gate electrode 123 covers the tip portion A of the electron injection region 107.

According to an embodiment, because electrons are injected from the electron injection region 107 during the programming of the non-volatile memory device, excellent programming characteristics can be achieved even if a low voltage is applied to the control gate region 119.

Accordingly, because there is no need for using a high voltage during the programming of the non-volatile memory device, a high voltage transistor is not required.

Additionally, because there is no need for a pump applying a high voltage to the non-volatile memory device, less power consumption is required.

After forming the gate electrode, a source region and drain region can be formed by ion-implanting second impurities on the semiconductor substrate at both sides of the floating gate electrode 123.

The second impurities can be n-type impurities. For example, the n-type impurities are phosphorus (P) or arsenic (As).

The read and program operations of the non-volatile memory device having the above structure are described with reference to the following Table 1.

TABLE 1

| | Control gate region | Electron injection region | Source region | Drain region |
|---|---|---|---|---|
| Read | 1.5 V~3.3 V | F (floating) | GND(ground) | 1~3.3 V |
| Program | 3.3 V | −3.3 V | GND/F | 3.3 V/F |

Table 1 illustrates a voltage applied to a floating gate region and an electron injection region when the non-volatile memory device is read or programmed.

According to Table 1, 3.3 V can be applied to the control gate region when programming the non-volatile memory device and −3.3 V can be applied to the electron injection region.

At this point, an electric potential difference of the control gate region and the electron injection region is 6.6 V (3.3−(−3.3))=6.6). Because a bias voltage of 6.6 V is applied to the tip portion of the electron injection region, electrons are tunneled and return to the floating gate electrode.

A voltage applied to program the non-volatile memory device can be about 3 V, that is, a level of a logic operating voltage.

A non-volatile memory device having a related art stack gate structure or a split gate structure requires a high voltage of about 10 V for programming. However, because the present invention uses the electron injection region having the tip portion, tunneling occurs easily and thus a low program voltage can be applied for programming.

Accordingly, because there is no need for providing the high voltage to the non-volatile memory device, the size of a high voltage driven device can be reduced.

The non-volatile memory device according to an embodiment uses fowler-nordheim (F-N) tunneling instead of channel hot electron injection. Therefore, less power consumption is required and a charge pump area in a circuit, required for an in system program (ISP) function, can be reduced.

Because the non-volatile memory device according to an embodiment has a single poly layer, manufacturing costs can be minimized. Additionally, device characteristics are improved by minimizing procedure operations that affect a logic process. That is, the minimized procedure operation does not affect logic processes and devices related to physical structure and heat budget.

The non-volatile memory device having the structure according to embodiments of the present invention can be applied to one time programmable (OTP) electrically erasable programmable read-only memory (EEPROM).

Because the non-volatile memory device does not require an additional high voltage transistor, the size of the decoder can be reduced and thus the size of a memory cell is also reduced.

Since the non-volatile memory device can be manufactured with a single poly layer such as for a logic device, the non-volatile memory fabrication processes are compatible with the logic device fabrication processes. For example, the second impurity well region below the electron injection region can be formed when forming a well region of a logic process.

Furthermore, unlike the logic process, an additional process does not affect the logic device. For example, because the process for forming the electron injection region is performed before the forming of the device isolation layer pattern, it does not affect another device.

According to an embodiment, because the thickness of the tunnel oxide layer can be thickly formed, cell reliability can be improved.

In addition, according to embodiments of the present invention, a control gate region can be formed on the active region of the semiconductor substrate without an additional control gate electrode structure, and the electron injection region can be formed with a bit line. Therefore, because manufacturing processes become simplified, their cost is reduced and device performance is enhanced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a non-volatile memory device, the method comprising:
   forming an oxide layer and a nitride layer on a semiconductor substrate;
   forming a first nitride layer pattern by selectively etching the nitride layer;
   doping the semiconductor substrate with first impurities using the first nitride layer pattern as a mask to form an electron injection region;
   forming a partial oxide layer pattern thicker than the oxide layer by oxidizing the electron injection region;
   forming a second nitride layer pattern by selectively etching the first nitride layer pattern;
   etching the semiconductor substrate using the second nitride layer pattern and the partial oxide layer pattern as a mask to form a trench around the electron injection region;
   forming a device isolation layer pattern by gap-filling the trench with a dielectric and then removing the second nitride layer pattern;

forming a control gate region by selectively implanting the semiconductor substrate with second impurities;

selectively etching the partial oxide layer pattern and a portion of the device isolation layer pattern to expose a top surface and a side surface of the electron injection region;

forming a first tunnel oxide layer and a second tunnel oxide layer by re-oxidizing an entire surface of the semiconductor substrate, the first tunnel oxide layer being on the control gate region, the second tunnel oxide layer being on the top surface and the side surface of the electron injection region; and forming a floating gate electrode covering at least a portion of the control gate region and an edge of the electron injection region, wherein the top surface of the electron injection region has an area concavely depressed, and wherein a portion of the floating gate is disposed in the concavely depressed area of the electron injection region.

2. The method according to claim 1, further comprising, before the forming of the control gate region:

forming a second impurity well region below the electron injection region by selectively implanting the semiconductor substrate with second impurities; and forming a first impurity well region by selectively implanting the semiconductor substrate with first impurities.

3. The method according to claim 2, wherein the control gate region is formed on a portion of the first impurity well region.

4. The method according to claim 1, wherein the edge of the electron injection region comprises a tip portion formed during the exposing of the top surface and side surface of the electron injection region.

5. The method according to claim 4, wherein the device isolation layer pattern comprises a groove having a depth lower than the tip portion.

6. The method according to claim 1, further comprising:

during the forming of the trench around the electron injection region, etching the semiconductor substrate using the second nitride layer pattern as a mask to form a second trench defining an active area between the trench around the electron injection region and the control gate region;

forming a second isolation layer pattern by gap filling the second trench with the dielectric; and after forming the floating gate electrode, forming a source and drain region for the floating gate electrode in the active area.

* * * * *